United States Patent
Shen et al.

(10) Patent No.: US 10,324,325 B2
(45) Date of Patent: Jun. 18, 2019

(54) BLACK MATRIX MASK, METHOD FOR MANUFACTURING BLACK MATRIX, AND APPLICATION THEREOF

(71) Applicant: Wuhan China Star Optoelectronics Technology Co., Ltd., Wuhan (CN)

(72) Inventors: Jiawun Shen, Wuhan (CN); Yingbin Jia, Wuhan (CN); Haoran Sun, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 184 days.

(21) Appl. No.: 15/119,722

(22) PCT Filed: Jul. 27, 2016

(86) PCT No.: PCT/CN2016/091812
§ 371 (c)(1),
(2) Date: Aug. 18, 2016

(87) PCT Pub. No.: WO2018/000491
PCT Pub. Date: Jan. 4, 2018

(65) Prior Publication Data
US 2018/0180931 A1   Jun. 28, 2018

(30) Foreign Application Priority Data

Jun. 29, 2016 (CN) .......................... 2016 1 0493901

(51) Int. Cl.
*G03F 7/20* (2006.01)
*G02F 1/1335* (2006.01)
(Continued)

(52) U.S. Cl.
CPC ....... *G02F 1/133512* (2013.01); *G02B 5/201* (2013.01); *G02F 1/133516* (2013.01);
(Continued)

(58) Field of Classification Search
CPC . G03F 7/0007; G03F 1/00; G03F 1/50; G03F 1/54; G03F 1/58; G02B 5/201;
(Continued)

(56) References Cited

U.S. PATENT DOCUMENTS

2007/0141484 A1   6/2007   Lee
2008/0266691 A1*  10/2008  Kaihoko ................ G02B 5/205
                                                          359/885
(Continued)

FOREIGN PATENT DOCUMENTS

CN    103890657 A    6/2014
CN    204790305 U    11/2015
CN    105717737 A    6/2016

*Primary Examiner* — John A McPherson
(74) *Attorney, Agent, or Firm* — Leong C. Lei

(57) ABSTRACT

The present invention relates to a black matrix mask, a method for manufacturing a black matrix, and an application thereof. The black matrix mask includes a light-shielding layer having a predetermined transmission rate and coated along an edge of a black matrix pattern of the black matrix mask. The present invention also provides methods for manufacturing a black matrix, a color filter, an array substrate, and a liquid crystal display device. The method for manufacturing the black matrix includes: Step 100: using the black matrix mask to subject a black matrix material layer on a base plate to exposure; Step 200: subjecting the exposed black matrix material layer to development; and Step 300: subjecting the developed black matrix material layer to baking to finally form a black matrix on the base plate. The black matrix mask and the methods for manufacturing a black matrix, a color filter, an array substrate, and a liquid (Continued)

crystal display devices according to the present invention increase the taper of the black matrix and help enhance the aperture ratio of products.

8 Claims, 4 Drawing Sheets

(51) Int. Cl.
    *G03F 1/50*            (2012.01)
    *G02B 5/20*            (2006.01)
    *G03F 1/32*            (2012.01)
    *G03F 7/00*            (2006.01)
    *G03F 7/30*            (2006.01)
    *G03F 1/00*            (2012.01)

(52) U.S. Cl.
    CPC ................ *G03F 1/00* (2013.01); *G03F 1/32* (2013.01); *G03F 1/50* (2013.01); *G03F 7/0007* (2013.01); *G03F 7/30* (2013.01); *G02F 2202/104* (2013.01)

(58) Field of Classification Search
    CPC ......... G02F 1/133512; G02F 1/133516; G02F 2202/104
    USPC ...................................... 430/5; 349/106, 110
    See application file for complete search history.

(56) References Cited

U.S. PATENT DOCUMENTS

2009/0279011 A1* 11/2009 Baek ................... G02F 1/13452
                                                     349/46
2013/0222936 A1*  8/2013 Kawanishi ............ G02B 5/223
                                                    359/891
2014/0045102 A1*  2/2014 Jang .................... G03F 7/0035
                                                      430/5
2018/0101092 A1*  4/2018 He ........................ G03F 1/32

* cited by examiner exposure development baking

BLACK MATRIX MASK, METHOD FOR MANUFACTURING BLACK MATRIX, AND APPLICATION THEREOF

BACKGROUND OF THE INVENTION

1. Field of the Invention

The present invention relates to the field of liquid crystal display technology, and in particular to a black matrix mask, a method for manufacturing a black matrix, and an application thereof.

2. The Related Arts

Recently, low temperature poly-silicon (LTPS) panels have gained wide applications in high-end mobile phones and tablet computers. The LTPS panels use low temperature poly-silicon that has high mobility to make a thin-film transistor. Such panels have advantages, including high resolution, low power consumption, high response speed, and high aperture ratio and will potentially become the next generation for medium- and small-sized display panels.

Due to the trend for pursuit of higher PPI (pixels per inch) for LTPS products, the line width of a black matrix (BM) of a color filter is getting smaller and smaller. With the narrowing of the line width of the black matrix, an angle of a taper of the black matrix needs to be made more approaching to 90 degrees in order to prevent reduction of aperture ratio due to increase of PPI. However, the known black matrix materials are constrained from having a taper angle thereof exceeding 90 degrees due to the need for better processability Referring to FIG. 1A, a schematic view is given to illustrate a taper angle of a conventional black matrix. As a part of a complete liquid crystal panel or a color filter structure, the black matrix 11 is formed on a first base plate 10 and is arranged between the first base plate 10 and a second base plate 20. Light emitting from a backlight source transmits through the second base plate 20 and travels toward the first base plate 10. The black matrix 11 has a line width of 5 micrometers and a taper angle A less than 90 degrees. The smaller the taper angle A of the black matrix 11 is, the more easily light will be shielded, the smaller the aperture ratio will be, and the lower the transmission rate will be. Referring to FIG. 1B, a schematic view is given to illustrate an ideal taper angle of a black matrix. Under the same condition of light width being 5 micrometers, ideally, the black matrix 12 located between the first base plate 10 and the second base plate 20 has a taper angle A that can be made greater than 90 degrees, such that the larger the angle is, the larger the aperture ratio will be and the higher the transmission rate will be.

Referring to FIGS. 2A-2D, FIG. 2A is a schematic view illustrating a conventional black matrix manufacturing process; FIG. 2B is a mask pattern used in the conventional black matrix manufacturing process; FIG. 2C is a mask used in the conventional black matrix manufacturing process; and FIG. 2D is a conventional black matrix manufactured. The conventional black matrix manufacturing process generally comprises exposure, development, and baking. During such a process, the black matrix material layer 30 undergoes continuous deformation to finally form a black matrix 31 on a base plate 32. Firstly, the mask 33 shown in FIG. 2C is used to subject a black matrix material layer 30 to exposure, where the mask 33 comprises a mask pattern 34 provided thereon. Under this condition, crosslink is induced on a surface of the black matrix material layer 30. Next, the exposed black matrix material layer 30 is subjected to development, in which a development solution corrodes into a bottom layer of the black matrix material layer 30 to form an undercut, so that eaves of the taper is relatively long. Thus, during a subsequent operation that the black matrix material layer 30 is subjected to post baking, the black matrix material layer 30 will easily undergo thermal flow, moving in the direction indicated by arrows to make the taper smooth so as to finally forming the black matrix 31 on the base plate 32. Such a black matrix 31 manufactured with the known process involves the drawback of being hard to get the taper exceeding 90 degrees, making it adverse to increase of aperture ratio.

SUMMARY OF THE INVENTION

An object of the present invention is to provide a black matrix mask, which increases a taper angle of a black matrix manufactured therewith.

Another object of the present invention is to provide a method for manufacturing a black matrix, which uses the above black matrix mask to increase a taper angle of a black matrix.

A further object of the present invention is to provide a method for manufacturing a color filter, which uses the above method for manufacturing a black matrix mask to increase a taper angle of a black matrix.

A further object of the present invention is to provide a method for manufacturing an array substrate, which uses the above method for manufacturing a black matrix mask to increase a taper angle of a black matrix.

Still a further object of the present invention is to provide a method for manufacturing a liquid crystal display device, which uses the above method for manufacturing a black matrix mask to increase a taper angle of a black matrix.

To achieve the above objects, the present invention provides a black matrix mask, which comprises a light-shielding layer having a predetermined transmission rate and coated along an edge of a black matrix pattern of the black matrix mask.

To achieve the above objects, the present invention also provides a method for manufacturing the black matrix using the above-described black matrix mask, which comprises:

Step 100: using the black matrix mask to subject a black matrix material layer on a base plate to exposure;

Step 200: subjecting the exposed black matrix material layer to development; and Step 300: subjecting the developed black matrix material layer to baking to finally form a black matrix on the base plate.

In the above method for manufacturing the black matrix, the black matrix has a taper that is greater than 90 degrees.

In the above method for manufacturing the black matrix, the black matrix has a line width of 5 micrometers.

In the above method for manufacturing the black matrix, Step 200 uses a development solution to subject the exposed black matrix material layer to wet etching.

In the above method for manufacturing the black matrix, a taper angle of the black matrix is controlled by setting transmission rate of the light-shielding layer.

To achieve the above objects, the present invention further provides a method for manufacturing a color filter, wherein the color filter comprises a black matrix that is manufactured with the above-described method.

To achieve the above objects, the present invention further provides a method for manufacturing an array substrate, wherein the array substrate comprises a black matrix that is manufactured with the above-described method.

To achieve the above objects, the present invention further provides a method for manufacturing a liquid crystal display device, wherein the liquid crystal display device comprises a black matrix that is manufactured with the above-described method In the above method, the liquid crystal display device is a low temperature poly-silicon (LTPS) liquid crystal display device.

In summary, the present invention provides a black matrix mask and methods for manufacturing a black matrix, a color filter, an array substrate, and a liquid crystal display device to increase a taper angle of the black matrix and help increase the aperture ratio of products.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawing.

DETAILED DESCRIPTION OF THE PREFERRED EMBODIMENTS

Figure 4:
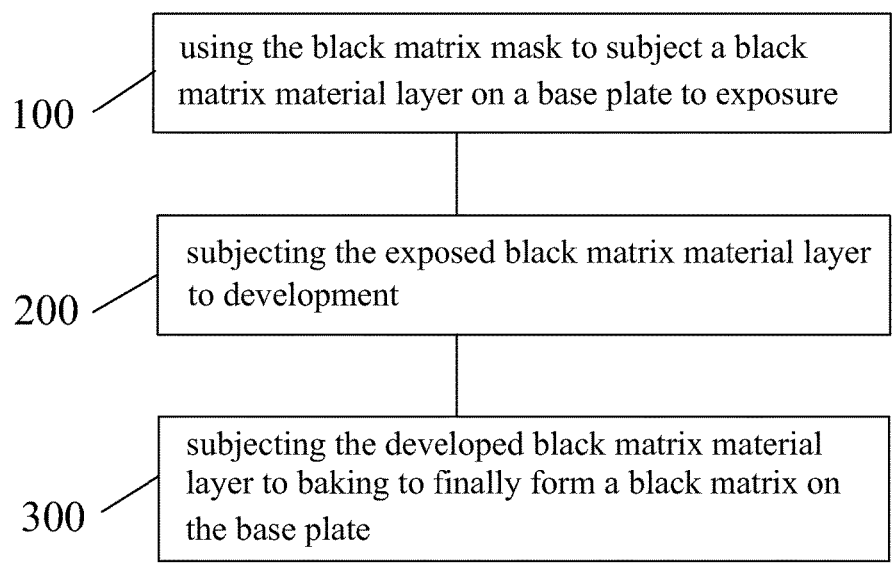
FIG. 4 is a flow chart illustrating a method for manufacturing a black matrix according to the present invention.

Referring to FIG. 4, a flow chart is provided for illustrating a method for manufacturing a black matrix according to the present invention. The method generally comprises:

Step 100: using a black matrix mask provided in the present invention to subject a black matrix material layer on a base plate to exposure;

Step 200: subjecting the exposed black matrix material layer to development; and Step 300: subjecting the developed black matrix material layer to baking to finally form a black matrix on the base plate.

Figure 1A:
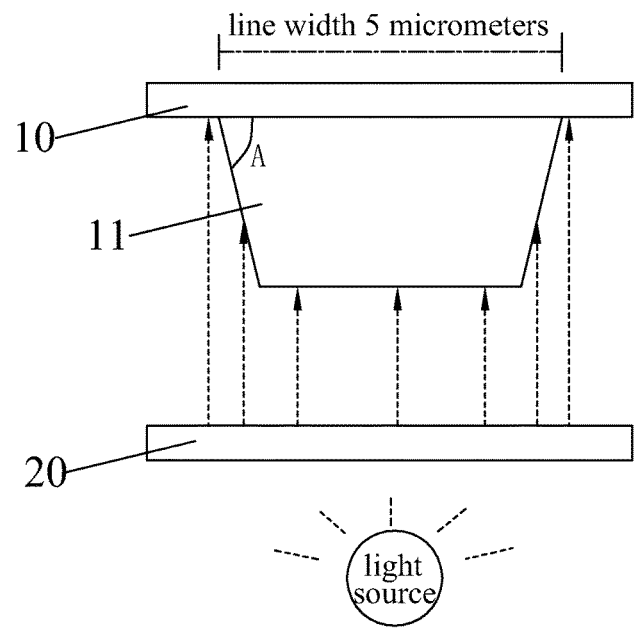
FIG. 1A is a schematic view illustrating a taper angle of a conventional black matrix.
Figure 1B:
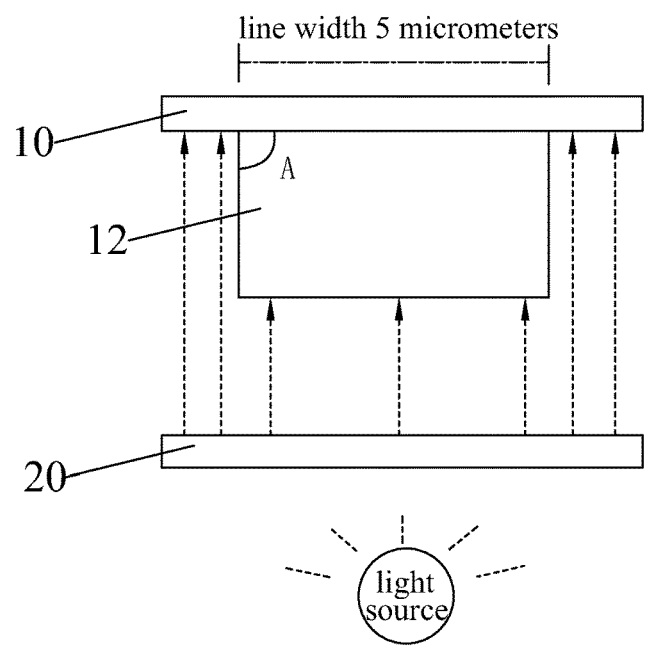
FIG. 1B is a schematic view illustrating an ideal taper angle of a black matrix.
Figure 2A:
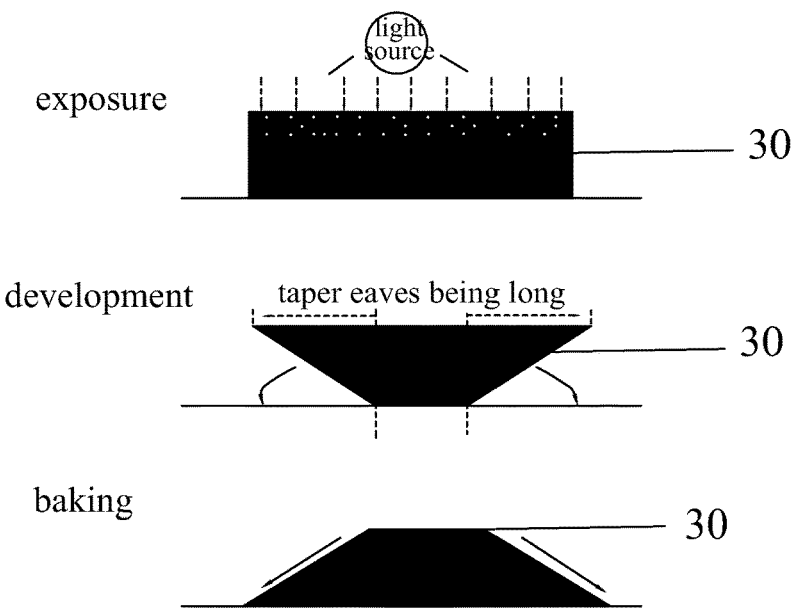
FIG. 2A is a schematic view illustrating a conventional black matrix manufacturing process.
Figure 2B:
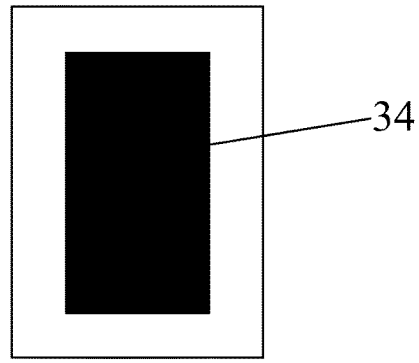
FIG. 2B is a mask pattern used in the conventional black matrix manufacturing process.
Figure 2C:
FIG. 2C is a mask used in the conventional black matrix manufacturing process.
Figure 2D:
FIG. 2D is a conventional black matrix manufactured.
Figure 3A:
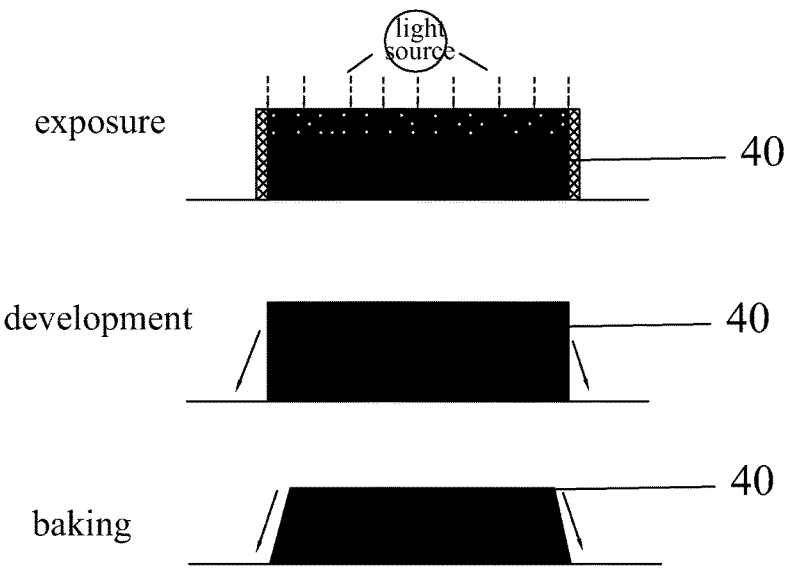
FIG. 3A is a schematic view illustrating a black matrix manufacturing process of a preferred embodiment of a method for manufacturing a black matrix according to the present invention.
Figure 3B:
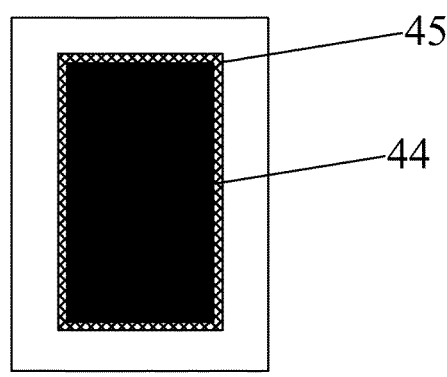
FIG. 3B is a mask pattern of a preferred embodiment of a black matrix mask of the present invention.
Figure 3C:
FIG. 3C is a schematic view of preferred embodiment of a black matrix mask according to the present invention.
Figure 3D:
FIG. 3D is a black matrix manufactured by using a preferred embodiment of a black matrix mask according to the present invention.

A detailed description will be given, with reference to FIGS. 3A-3D, to a process of manufacturing a black matrix according to the present invention. FIG. 3A is a schematic view illustrating a manufacturing process of the black matrix; FIG. 3B illustrates a mask pattern of a preferred embodiment of a black matrix mask according to a preferred embodiment of the present invention; FIG. 3C is a schematic view illustrating a preferred embodiment of the black matrix mask according to the present invention; and FIG. 3D is a black matrix manufactured with the present invention. Those skilled in the art may appreciate that description of known steps, such as cleaning of the base plate and coating of the black matrix material, will be omitted herein.

Firstly, a mask 43 illustrated in FIG. 3C is used to subject a black matrix material layer 40 to exposure and under such a condition, crosslinking is caused on a surface of the black matrix material layer 40. The mask 43 is provided with a mask pattern 44 (solid hatch portion) shown in FIG. 3B. The mask pattern 44 is coated, on a peripheral edge thereof, with a light-shielding layer 45 (crossing line hatch portion) having a controllable transmission rate. In other words, the edge of the light-shielding layer 45 is of a halftone design, allowing the portion of the black matrix material layer 40 that corresponds to the light-shielding layer 45 to become loose after being subjected to exposure with an exposure machine, meaning the edge has insufficient crosslinking, showing characteristics that is not resistant to development during a development process so as to make a taper angle large. Structures of the mask pattern 44 and the light-shielding layer 45 that are formed in the black matrix material layer 40 after exposure with the exposure machine are respectively indicated by the solid hatch portion and the crossing line hatch portion. Next, the exposed black matrix material layer 40 is subjected to development such that the portion of the black matrix material layer 40 that corresponds to the halftone is washed off with the development and eaves of the taper angle is shortened. Under this condition, line width of the black matrix material layer 40 is narrowed. Since the development solution does not react completely with a structure loose portion of the black matrix material layer 40, after the black matrix material layer 40 is subjected to post baking, thermal flow of the black matrix material layer 40 becomes poor so that the black matrix material layer 40 is just partly melted to flow, in the direction indicated by arrows, to the bottom to make a line width of the bottom of the black matrix material layer 40 just reaches a preset line width, and eventually forming the black matrix 41 on the base plate 42. Apparently, a black matrix 41 manufactured with such a process allows for strict control of line width without reducing the aperture ratio. The present invention adopts an edge halftone design to form a black matrix such that an edge corresponding to the halftone preserves an amount of deformation for performance of baking on the black matrix, whereby the line width of the black matrix so processed can be ensured without affecting the aperture ratio.

The present invention provides a black matrix mask that can be used to make a black matrix and a color filter, an array substrate, and a liquid crystal display device associated therewith. The present invention is structured to include a halftone design on an edge of a black matrix pattern of an existing black matrix mask in order to use different light transmission rates to control the taper angle of the black matrix for achieving a desired result of a greater taper of the black matrix (which is greater than 90 degrees). The known LTPS products often suffer reduction of aperture ratio due to development for high resolution products, but the present invention can be used to increase the transmission rate of the products and increase the taper of the black matrix to help enhance the aperture ratio of the products.

In summary, the present invention provides a black matrix mask and methods for manufacturing a black matrix, a color filter, an array substrate, and a liquid crystal display device to increase a taper angle of the black matrix and help increase the aperture ratio of products.

Based on the description given above, those having ordinary skills of the art may easily contemplate various changes and modifications of the technical solution and technical ideas of the present invention and all these changes and modifications are considered within the protection scope of right for the present invention as defined in the appended claims.

What is claimed is:

1. A method for manufacturing a black matrix using a black matrix mask that comprises a light-shielding layer having a controllable transmission rate and coated along an edge of a black matrix pattern of the black matrix mask, the method comprising:

Step 100: using the black matrix mask to subject a black matrix material layer on a base plate to exposure wherein a portion of the black matrix material layer that corresponds to the light-shielding layer of the black matrix mask becomes loose with insufficient crosslinking of the portion of the black matrix material layer so as to form a structure loose portion of the black matrix material layer;

Step 200: subjecting the exposed black matrix material layer to development with a development solution, wherein the structure loose portion of the black matrix material that corresponds to the light-shielding layer of the black matrix mask undergoes incomplete reaction with the development solution; and Step 300: subjecting the developed black matrix material layer to baking to finally form a black matrix on the base plate, wherein the structure loose portion of the black matrix material that undergoes incomplete reaction with the development solution is partly melted and shows reduced flowability in a direction towards a bottom of the black matrix material layer so as to form a preset line width of the bottom of the black matrix material layer and provide a taper of the black matrix;

wherein the taper of the black matrix is greater than 90 degrees.

2. The method for manufacturing the black matrix as claimed in claim 1, wherein the black matrix has a line width of 5 micrometers.

3. The method for manufacturing the black matrix as claimed in claim 1, wherein Step 200 uses a development solution to subject the exposed black matrix material layer to wet etching.

4. The method for manufacturing the black matrix as claimed in claim 1, wherein a taper angle of the black matrix is controlled by setting transmission rate of the light-shielding layer.

5. A method for manufacturing a color filter, wherein the color filter comprises a black matrix that is manufactured with the method as claimed in claim 1.

6. A method for manufacturing an array substrate, wherein the array substrate comprises a black matrix that is manufactured with the method as claimed in claim 1.

7. A method for manufacturing a liquid crystal display device, wherein the liquid crystal display device comprises a black matrix that is manufactured with the method as claimed in claim 1.

8. The method for manufacturing the liquid crystal display device as claimed in claim 7, wherein the liquid crystal display device is a low temperature poly-silicon (LTPS) liquid crystal display device.

* * * * *